(12) United States Patent
Scheid et al.

(10) Patent No.: US 7,197,597 B1
(45) Date of Patent: *Mar. 27, 2007

(54) PERFORMING LOOKUP OPERATIONS IN A CONTENT ADDRESSABLE MEMORY BASED ON HASHED VALUES OF PARTICULAR USE IN MAINTAINING STATISTICS FOR PACKET FLOWS

(75) Inventors: Stephen Francis Scheid, Campbell, CA (US); Jason Allen Marinshaw, Santa Clara, CA (US); Venkateshwar Rao Pullela, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 236 days.

This patent is subject to a terminal disclaimer.

(21) Appl. No.: 10/625,012

(22) Filed: Jul. 22, 2003

(51) Int. Cl.
*G06F 12/00* (2006.01)

(52) U.S. Cl. ...................................... 711/106

(58) Field of Classification Search ............... None
See application file for complete search history.

(56) References Cited

U.S. PATENT DOCUMENTS

| | | | |
|---|---|---|---|
| 6,295,576 B1 | 9/2001 | Ogura et al. | |
| 6,374,326 B1 | 4/2002 | Kansal et al. | |
| 6,377,577 B1 | 4/2002 | Bechtolsheim et al. | 370/392 |
| 6,389,506 B1 | 5/2002 | Ross et al. | |
| 6,526,474 B1 | 2/2003 | Ross | |
| 6,535,951 B1 | 3/2003 | Ross | |
| 6,643,260 B1 | 11/2003 | Kloth et al. | |
| 6,651,096 B1 | 11/2003 | Gai et al. | |
| 6,658,002 B1 | 12/2003 | Ross et al. | |
| 6,658,458 B1 | 12/2003 | Gai et al. | |
| 6,687,144 B2 | 2/2004 | Batson et al. | |
| 6,715,029 B1 | 3/2004 | Trainin et al. | |
| 6,717,946 B1 | 4/2004 | Hariguchi et al. | |
| 6,738,862 B1 | 5/2004 | Ross et al. | |
| 6,775,737 B1 | 8/2004 | Warkhede et al. | |
| 6,788,683 B1 * | 9/2004 | Ikeda et al. | 370/389 |
| 6,862,281 B1 | 3/2005 | Chandrasekaran | |
| 6,871,262 B1 | 3/2005 | Oren et al. | |
| 6,871,265 B1 | 3/2005 | Oren et al. | |
| 6,961,808 B1 | 11/2005 | Oren et al. | |

(Continued)

OTHER PUBLICATIONS

U.S. Appl. No. 10/625,063, filed Jul. 22, 2003, Pullela et al.

(Continued)

*Primary Examiner*—Mano Padmanabhan
*Assistant Examiner*—Duc T Doan
(74) *Attorney, Agent, or Firm*—The Law Office of Kirk D. Williams

(57) ABSTRACT

A value is hashed and then a lookup operation is performed in a content addressable memory based on the hashed value to generate a content addressable memory result, which is used in performing an operation. In one implementation, the content addressable memory result includes an address, and the operation performed includes retrieving a record from memory, comparing a key value stored in the record to the first value to identify the correct record, and then updating a statistics value in the record. In one embodiment, an original value is masked to generate the value which is hashed. In one implementation, the value corresponds to a masked or original flow identification value associated with a flow of packets.

25 Claims, 11 Drawing Sheets

U.S. PATENT DOCUMENTS

| | | | |
|---|---|---|---|
| 7,023,853 B1 | 4/2006 | Bechtolsheim et al. | 370/392 |
| 2004/0028041 A1* | 2/2004 | Yasue | 370/389 |
| 2004/0100950 A1* | 5/2004 | Basu et al. | 370/389 |
| 2005/0010612 A1 | 1/2005 | Enderwick et al. | |

OTHER PUBLICATIONS

U.S. Appl. No. 09/862,018, filed May 21, 2001, David R. Cheriton.

U.S. Appl. No. 11/322,135, filed Dec. 28, 2005, David R. Cheriton.

* cited by examiner

ACCESS CONTROL LIST /
ASSOCIATIVE MEMORY
ENTRIES
170

ENTRIES 171
- 1: VALUE TO MATCH (E.G., CORRESPONDING TO A FLOW IDENTIFICATION VALUE) — 172
- ...
- N

ACCESS CONTROL LIST /
ADJUNCT MEMORY
ENTRIES
180

ENTRIES 181
- 1: FLOW IDENTIFICATION VALUE MASK (182) | ACL PROCESSING INDICATIONS (183) | OTHER INDICATIONS (184)
- ...
- M

FIGURE 1C

PERFORMING LOOKUP OPERATIONS IN A CONTENT ADDRESSABLE MEMORY BASED ON HASHED VALUES OF PARTICULAR USE IN MAINTAINING STATISTICS FOR PACKET FLOWS

TECHNICAL FIELD

One embodiment of the invention especially relates to communications and computer systems; and more particularly, one embodiment relates to hashing a value and then performing a lookup operation in a content addressable memory based on the hashed value, which may be of particular use in a packet switching system such as with the value corresponding to a flow identification value or masked flow identification value of a flow of packets.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP).

A flow is a set of packets passing through a network during a certain time interval that possess some common properties. A flow identification value is a way of identifying a particular flow. For example, a flow for IPv4 might be identified by the flow identification value consisting of, or including the tuple {source address, destination address, source port, destination port, protocol type}. A flow typically has a stream of packets associated with it. The identification of which flow a particular packet belongs is useful for determining how to process one or more packets in the stream of packets.

However, certain applications such as, but not limit to billing, statistics collection, routing, quality of service, access control, network management, and others may not need to know the actual flow with which a packet is actually associated. Rather, for example, an application might only be concerned with processing packets based on a source address, a source—destination address pair, etc. In this situation, a prior system has applied the same flow mask to the flow label associated with each packet to mask out the fields not of interest. This is fine if every packet's flow label is to be masked in the same manner and processed in the same manner. However, this is not always the case. For example, statistics and billing information might be desired to be collected for all packets from a particular source (irregardless of a packets destination), while simultaneously, billing information should be collected for each destination that a packet is sent from a different particular source address. Using a common or global mask for all packet flow does not allow desired individualized control.

In this situation, a prior system collects the most detailed information, and then post-processed this information to generate the desired results. However, this is inefficient as more information must be collect than that which is actually needed, and collection of this vast and unneeded amount of information may not be feasible, especially as packet rates continue to increase.

Another previous system selects a block mask of a ternary content addressable memory in response to the particular protocol type of a given packet. However, the number of block masks typically available is a small number, and being incapable of being expanded by several orders of magnitude to accommodate the vast number of flows being sent through a router. Thus, this prior approach does not provide adequate capabilities. Needed are new methods and mechanisms for dynamic processing of packets.

SUMMARY

Disclosed are, inter alia, methods, apparatus, data structures, computer-readable medium, mechanisms, and means for hashing a value and then performing a lookup operation in a content addressable memory based on the hashed value and its use in processing packets, such as, but not limited to a value including a flow identification value or masked flow identification value associated with a flow of packets. One embodiment identifies a first value and then performs a hashing function on it to generate a hashed first value. A lookup operation is then performed in a content addressable memory based on the hashed first value to generate a first content addressable memory result. An operation is then performed based on the first content addressable memory result. In one embodiment, the first content addressable memory result includes an address, and performing the operation includes: retrieving a record from memory, the record including a key value and a statistics value, comparing the key value to the first value, and updating a statistics value. In one embodiment, identifying the first value includes masking an original value with a mask value to generate the first value.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIG. 1C is a block diagram of access control list entries (e.g., associative and adjunct memory entries) used in one embodiment;

DETAILED DESCRIPTION

Figure 1A:
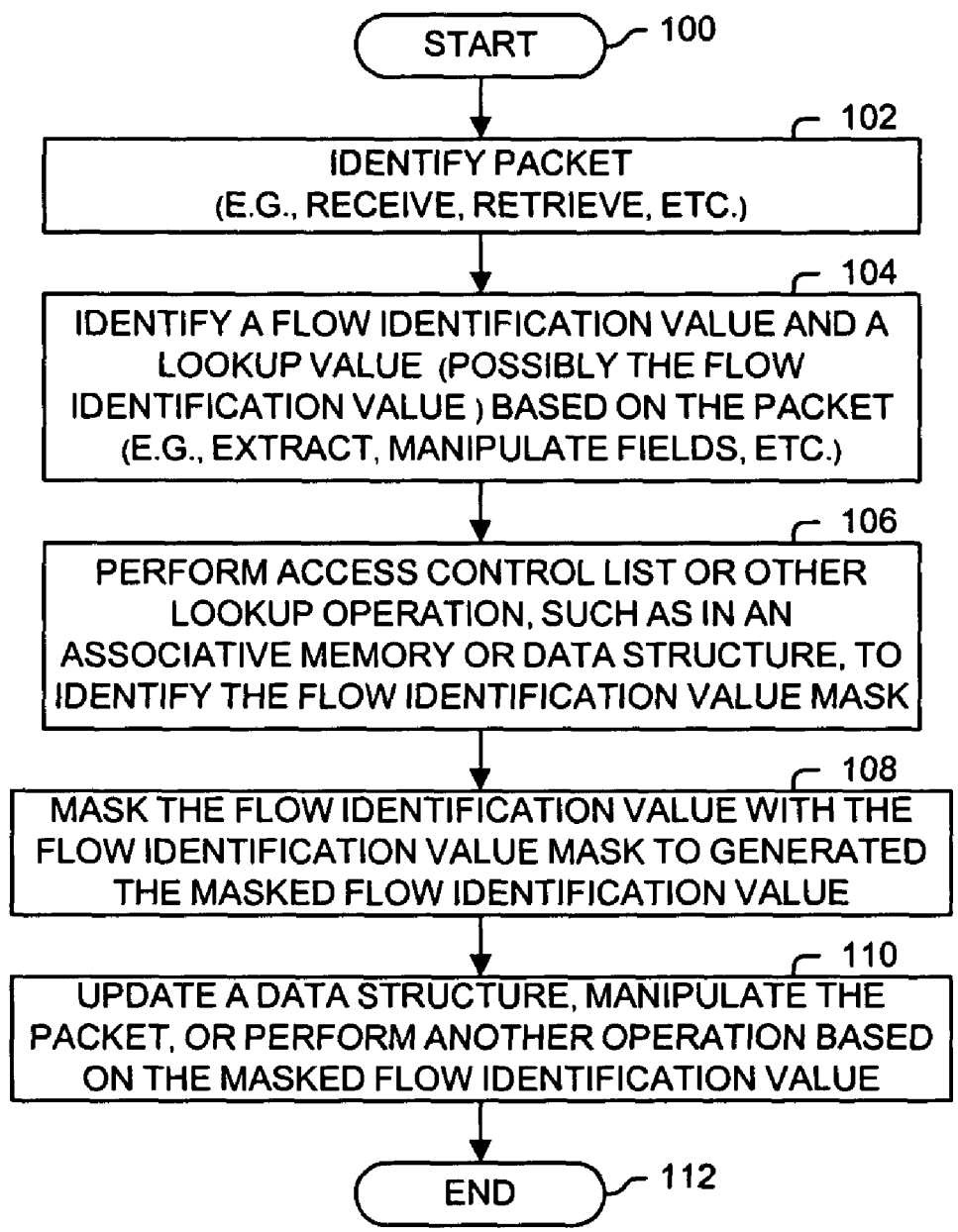
FIG. 1A is a flow diagram of a process used in one embodiment for identifying a flow identification value mask based on a flow (e.g., flow or other value) and corresponding processing a packet (e.g., updating a data structure, routing or dropping a packet, etc.)

Disclosed are, inter alia, methods, apparatus, data structures, computer-readable medium, mechanisms, and means for identifying a flow identification value mask based on a flow identification value of individual packets and its use, such as, but not limited to performing lookup operations and updating values in routers, packet switching systems, and other devices. Also disclosed are, inter alia, methods, apparatus, data structures, computer-readable medium, mechanisms, and means for hashing a value and then performing a lookup operation in a content addressable memory based on the hashed value and its use in routers, packet switching systems, and other devices.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable medium containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or identification of a packet. Moreover, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may be performed in the same or in a different serial or parallel ordering and/or by different components and/or processes, threads, etc., and/or over different connections and be combined with other functions in other embodiments in keeping within the scope and spirit of the invention. Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, and/or other storage mechanism that can be used to tangibly embody computer-executable instructions. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc. The term "associative memory" is an extensible term, and refers to all types of known or future developed associative memories, including, but not limited to binary and ternary content addressable memories, hash tables, TRIE and other data structures, etc. Additionally, the term "associative memory unit" may include, but is not limited to one or more associative memory devices or parts thereof, including, but not limited to regions, segments, banks, pages, blocks, sets of entries, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items.

Disclosed are, inter alia, methods, apparatus, data structures, computer-readable medium, mechanisms, and means for identifying a flow identification value mask based on a flow identification value of individual packets and its use, such as, but not limited to performing operations and updating values in routers, packet switching systems, and other devices. One embodiment identifies a flow identification value associated with a packet. A lookup operation is performed based on the flow identification value to identify the flow identification value mask, which can be used for processing packets and/or other operations. In one embodiment, the flow identification value is masked with the flow identification value mask to produce a masked flow identification value, and based on which, a value is updated in a data structure and/or other processing of the packet is performed. In one embodiment, the lookup operation employs an associative or content addressable memory. In one embodiment, flow identification value masks are included in access control list entries, and a lookup operation on the associative memory entries corresponding to the access control list entries identifies the flow identification value mask and possibly other processing information.

Disclosed are, inter alia, methods, apparatus, data structures, computer-readable medium, mechanisms, and means for hashing a value and then performing a lookup operation in a content addressable memory based on the hashed value and its use in processing packets, such as, but not limited to a value including a flow identification value or masked flow identification value associated with a flow of packets. One embodiment identifies a first value and then performs a hashing function on it to generate a hashed first value. A lookup operation is then performed in a content addressable memory based on the hashed first value to generate a first content addressable memory result. An operation is then performed based on the first content addressable memory result. In one embodiment, the first content addressable memory result includes an address, and performing the operation includes: retrieving a record from memory, the record including a key value and a statistics value, comparing the key value to the first value, and updating a statistics value. In one embodiment, identifying the first value includes masking an original value with a mask value to generate the first value.

FIG. 1A is a flow diagram of a process used in one embodiment for identifying a flow identification value mask based on a flow identification value (e.g., flow or other value) and corresponding processing a packet (e.g., updating a data structure, routing or dropping a packet, etc.) Processing begins with process block 100, and proceeds to process block 102, wherein a packet is identified (e.g., received, retrieved from memory or a queue, or acquired via any other mechanism). Next, in process block 104, a flow identification value and a corresponding lookup value are identified based on the packet (e.g., extracted and/or manipulated values/fields). In one embodiment, the flow identification value includes one or more (or all) fields of the tuple {source address, destination address, source port, destination port, protocol type}. In one embodiment, the flow identification value includes a transport layer, session layer, presentation layer or application layer value extracted from the identified packet, such as one or bits or fields extracted from the packet directly or after some manipulation or encoding. In one embodiment, the lookup value includes (and possibly is) the flow identification value itself, and typically, although not required, one or more other fields or bits for identifying, for example, a subset of entries searched and/or other details.

Next, in process block 106, a lookup operation is performed in a memory, associative memory, data structure, or other device based on the lookup value (e.g., flow identification or other value, etc.) to identify the corresponding flow identification value mask. In one embodiment, this lookup operation is performed on entries corresponding to those specified in an access control list, with these entries typically being stored in a memory, associative memory, data structure, or other device or mechanism. Next, in process block 108, the flow is masked with the flow identification value mask to generate a masked flow identification value; and in process block 110, some action is performed based on the masked flow identification value. This action may include updating a data structure, manipulating the packet (or another packet), and/or performing some other action. Processing is complete as indicated by process block 112.

Figure 1B:
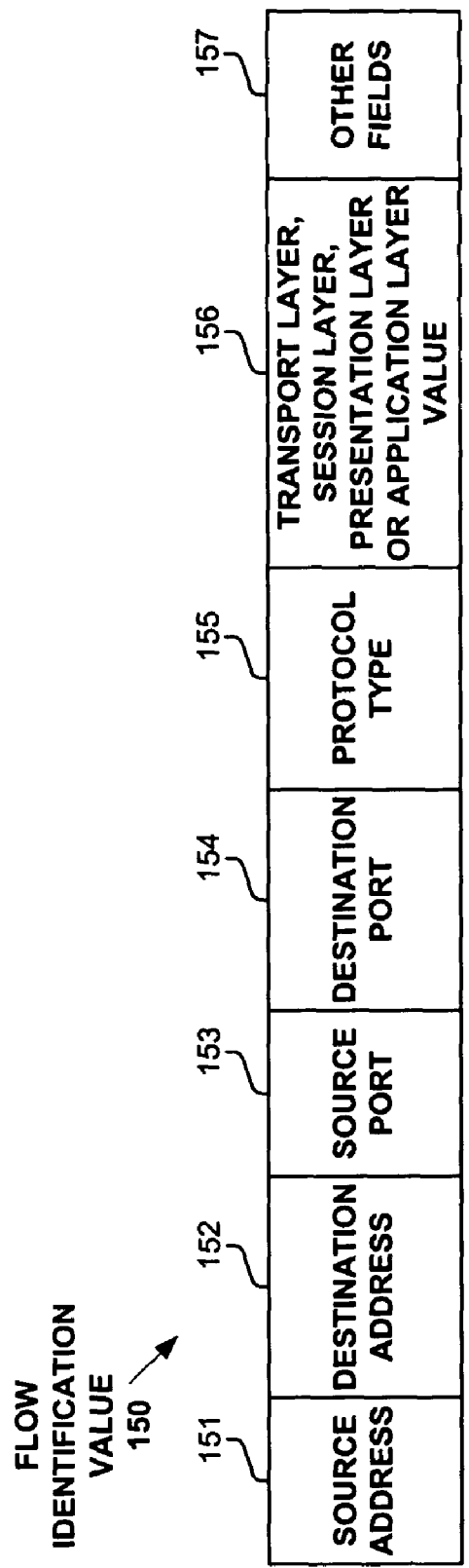
FIG. 1B is a block diagram of an exemplary flow used in one embodiment.

FIG. 1B is a block diagram of an exemplary flow identification value 150 used in one embodiment. As shown, a flow identification value may include one or more values or fields corresponding to a source address 151, destination address 152, source port 153, destination port 154, protocol type 155, transport layer, session layer, presentation layer or application layer value 156, and/or another field or value 157 (e.g., quality of service indications, TCP flags, etc.). In one embodiment, a flow identification value consists of the five fields 151–155 (in any order). In one embodiment, a flow identification value consists of one or more of the fields 151–157. In one embodiment, a flow identification value consists of the same fields for all flows; while in one embodiment, a flow identification value consists of different fields for at least two flows.

FIG. 1C is a block diagram of access control list entries (e.g., associative and adjunct memory entries) used in one embodiment. As shown, access control list/associative memory entries 170 includes n entries 171, each of the n entries including a value 172 to match (e.g., a flow identification or other value). Access control list/adjunct memory entries 180 includes m entries 181, each of the m entries include a flow identification value mask field 182. Typically, the values of n and m are equal, and each location within entries 170 corresponds to a location within entries 180, such as at the same address or a function thereof. In one embodiment, each entry 181 also includes access control list (ACL) processing indications 183 (e.g., permit, deny, etc.) and/or other indications or values 184, which may be used or updated. By allowing entries 181 to include values in addition to flow identification value masks 182, a single lookup operation can identify and/or update multiple indications 182–184.

Figure 2A:
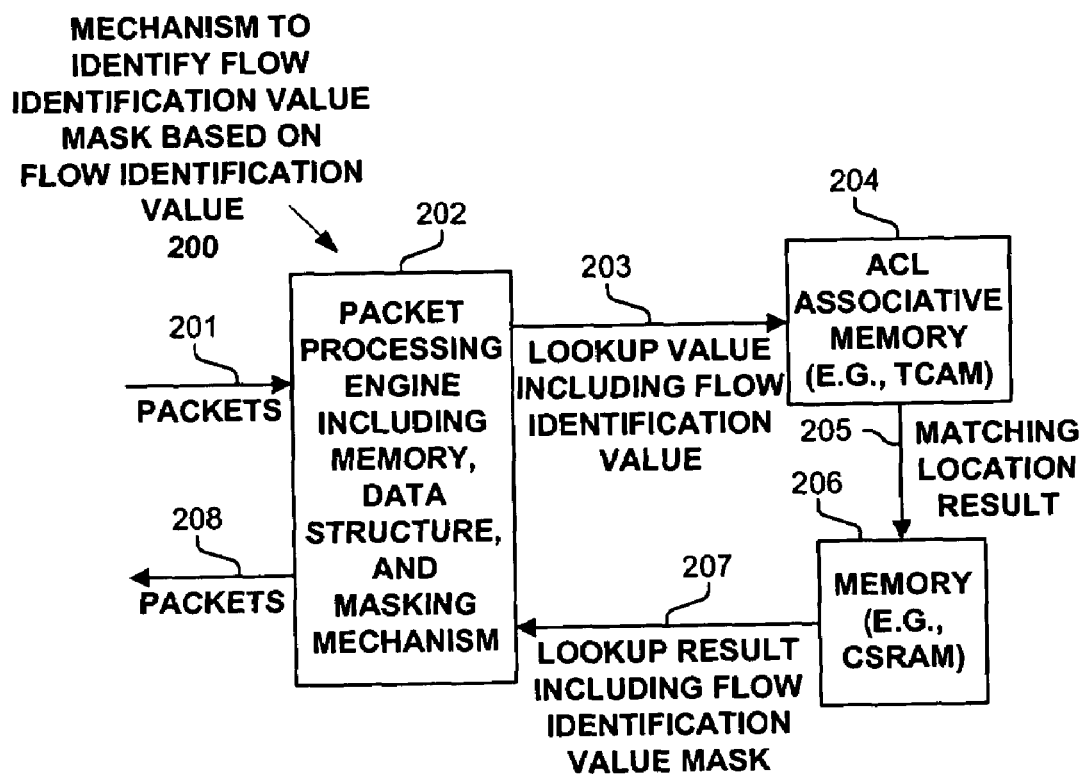
FIG. 2A is a block diagram of exemplary system used in one used in one embodiment for identifying a flow identification value mask based on a flow.

FIG. 2A is a block diagram of exemplary system used in one used in one embodiment for identifying a flow identification value mask based on a flow identification value. As shown, identifying flow identification value mask based on flow identification value mechanism 200 receives packets 201 and sends packets 208. Packet processing engine 202, typically includes memory (including a data structure for storing values and packets) and a masking mechanism. Packet processing engine 202 generates a lookup value 203, typically including or equal to the flow identification value of a received packet. Associative memory 204, possibly including access control list entries, performs a lookup operation based on lookup value 203 to generate matching location result 205. Adjunct memory 206 performs a lookup operation based on matching location result 205 to generate lookup result 207, which includes the flow identification value mask and possibly other values. Packet processing engine 202 typically performs some operation based on the flow identification value mask. In one embodiment, packet processing engine 202 masks the flow identification value with the flow identification value mask to generate a masked flow identification value, and updates a data structure accordingly or performs some other operation.

Figure 2B:
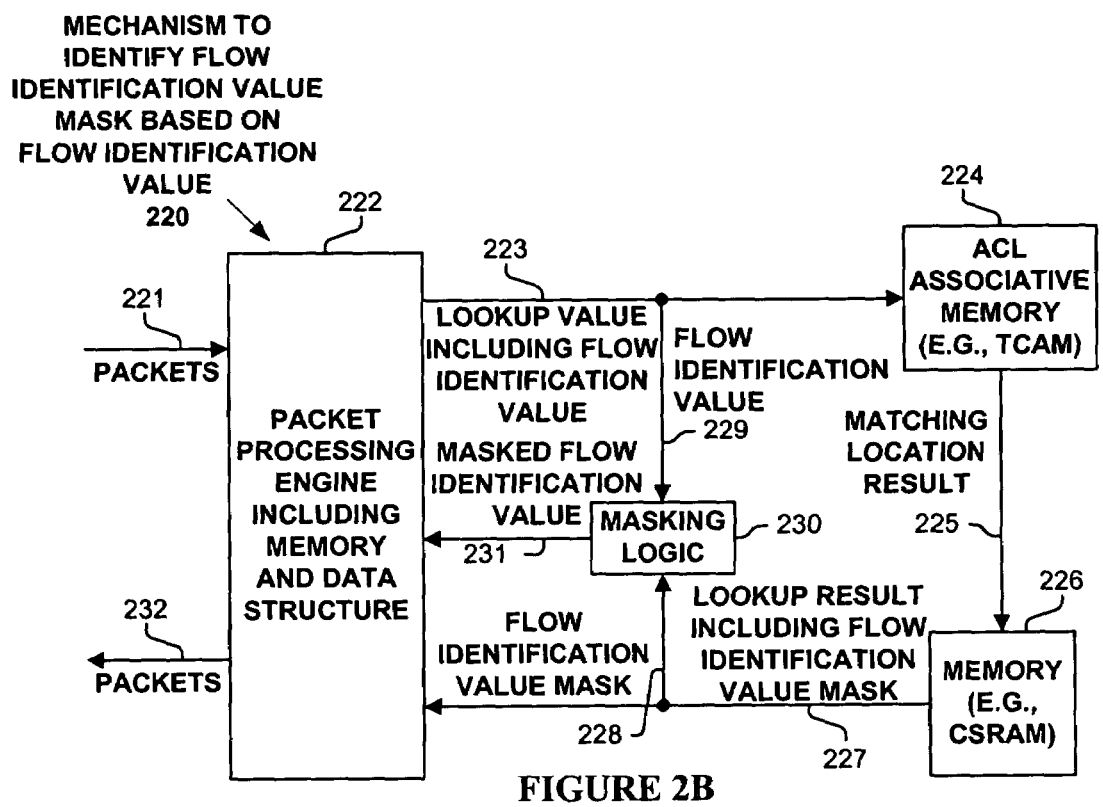
FIG. 2B is a block diagram of exemplary system used in one used in one embodiment for identifying a flow identification value mask based on a flow.

FIG. 2B is a block diagram of exemplary system used in one used in one embodiment for identifying a flow identification value mask based on a flow identification value. As shown, identifying flow identification value mask based on flow identification value mechanism 220 receives packets 221 and sends packets 232. Packet processing engine 222, typically includes memory (including a data structure for storing values and packets). Packet processing engine 222 generates a lookup value 223, typically including or equal to the flow identification value of a received packet. Associative memory 224, possibly including access control list entries, performs a lookup operation based on lookup value 223 to generate matching location result 225. Adjunct memory 226 performs a lookup operation based on matching location result 225 to generate lookup result 227, which includes the flow identification value mask and possibly other values. Lookup result 227 is typically provided to packet processing engine 222. In addition, masking logic 230 receives flow 229 and flow identification value mask 228 and produces masked flow identification value 231, typically using logic gates to perform bit level "and" operations (or any other masking technique or mechanism). Packet processing engine 222 typically performs some operation based on the masked flow identification value 231. In one embodiment, packet processor 222 performs some operation based on the flow identification value mask included in lookup result 227. In one embodiment, packet processing engine 222 updates a data structure accordingly or performs some other operation based on masked flow identification value 231 and/or lookup result 227.

Figure 2C:
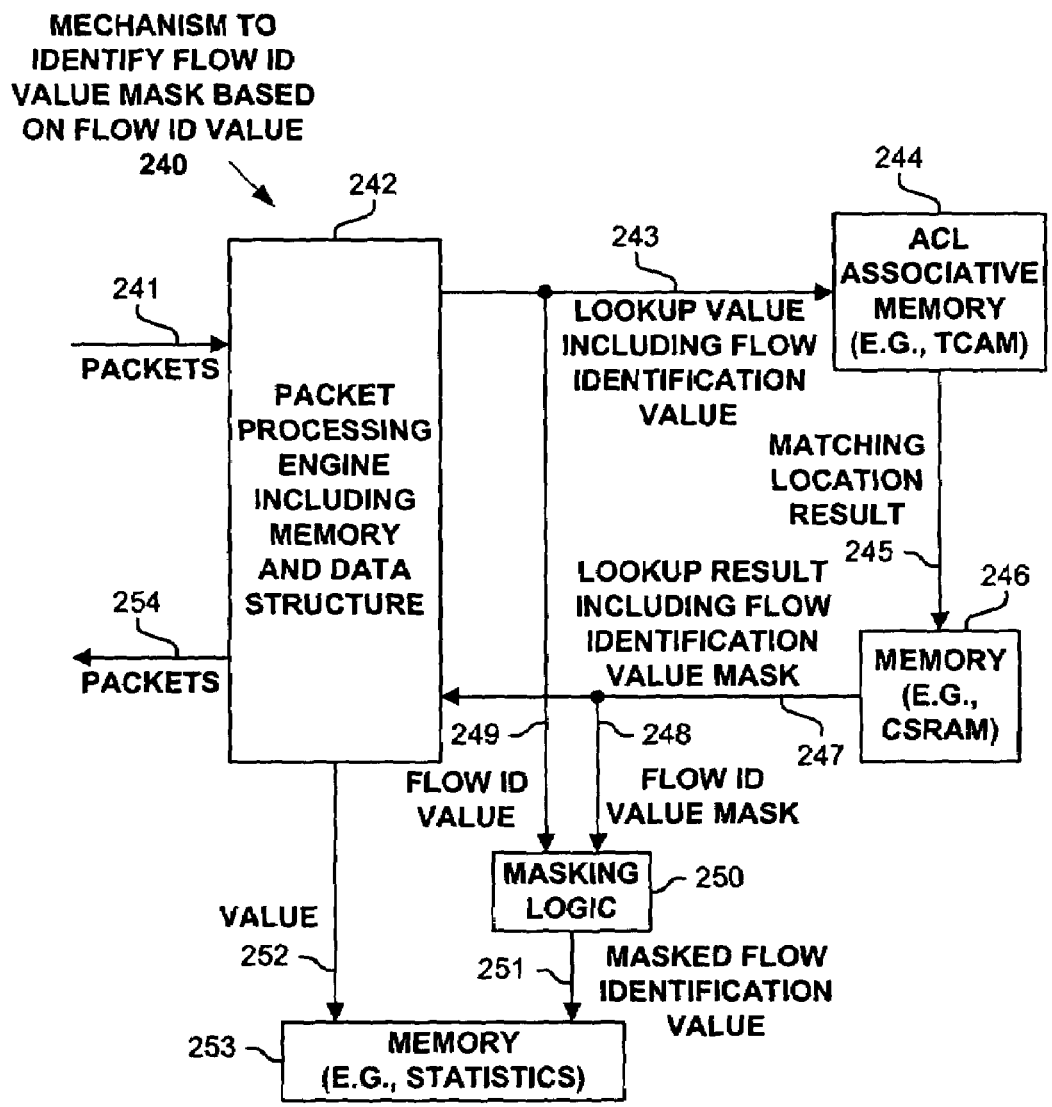
FIG. 2C is a block diagram of exemplary system used in one used in one embodiment for identifying a flow identification value mask based on a flow.

FIG. 2C is a block diagram of exemplary system used in one used in one embodiment for identifying a flow identification value mask based on a flow. As shown, identifying flow identification value mask based on flow identification value mechanism 240 receives packets 241 and sends packets 254. Packet processing engine 242, typically includes memory (including a data structure for storing values and packets). Packet processing engine 242 generates a lookup value 243, typically including or equal to the flow of a received packet. Associative memory 244, possibly including access control list entries, performs a lookup operation based on lookup value 243 to generate matching location result 245. Adjunct memory 246 performs a lookup operation based on matching location result 245 to generate lookup result 247, which includes the flow identification value mask and possibly other values. Lookup result 247 is typically provided to packet processing engine 242. In addition, masking logic 250 receives flow identification value 249 and flow identification value mask 248 and produces masked flow identification value 251, typically using logic gates to perform bit level "and" operations (or any other masking technique or mechanism). Masked flow identification value 251 is then used by memory device 253 to update a value, either by a predetermined amount (e.g., one for one packet, etc.), or based on value 252 (e.g., a byte count, etc.) generated by packet processing engine 242. In one embodiment, memory 253 includes control logic, such as to determine an address based on masked flow identification value 251. Of course, values can be extracted from memory 253 using any technique or mechanism, such as by packet processing engine 242 or another device.

Figure 2D:
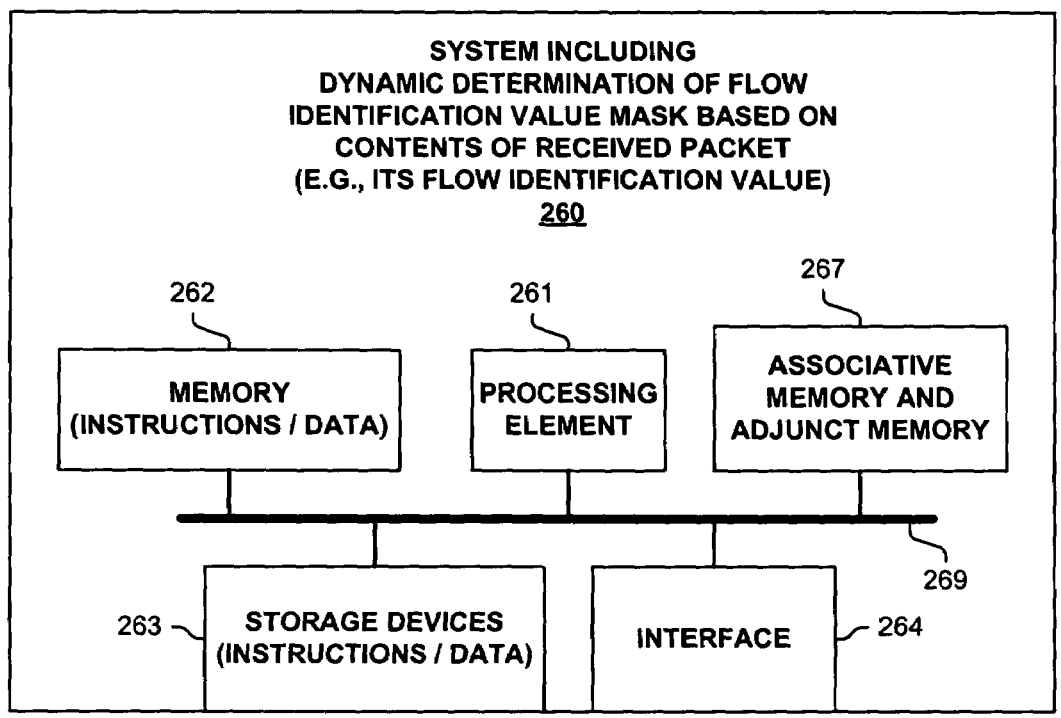
FIG. 2D is a block diagram of exemplary system used in one used in one embodiment for identifying a flow identification value mask based on a flow.

FIG. 2D is a block diagram of exemplary system 260 used in one used in one embodiment for identifying a flow identification value mask based on a flow. System 260 typically includes mechanisms and means for dynamically determining flow identification value masks based on contents of a receive packet, typically, but not limited to the packet's flow. In one embodiment, system 260 includes a processing element 261, memory 262, storage devices 263, an interface 264 for receiving and transmitting packets or other processed information, and an associative memory and adjunct memory devices 267, which are coupled via one or more communications mechanisms 269 (shown as a bus for illustrative purposes).

Various embodiments of system 260 may include more or less elements. The operation of system 260 is typically controlled by processing element 261 using memory 262 and storage devices 263 to perform one or more tasks or processes, such as to identify a flow identification value based on a received packet, perform a lookup operation to identify the corresponding flow identification value mask (possibly using associative memory and adjunct memory devices 267), masking the flow identification value with the flow identification value mask to generate the masked flow identification value, and performing some operation based on the masked flow identification value (e.g., updating a data structure in memory 262 or storage devices 263, manipulating a received packet, etc.).

Memory 262 is one type of computer-readable medium, and typically comprises random access memory (RAM), read only memory (ROM), flash memory, integrated circuits, and/or other memory components. Memory 262 typically stores computer-executable instructions to be executed by processing element 261 and/or data which is manipulated by processing element 261 for implementing functionality in accordance with one embodiment of the invention. Storage devices 263 are another type of computer-readable medium, and typically comprise solid state storage media, disk drives, diskettes, networked services, tape drives, and other storage devices. Storage devices 263 typically store computer-executable instructions to be executed by processing element 261 and/or data which is manipulated by processing element 261 for implementing functionality in accordance with one embodiment of the invention.

Figure 3A:
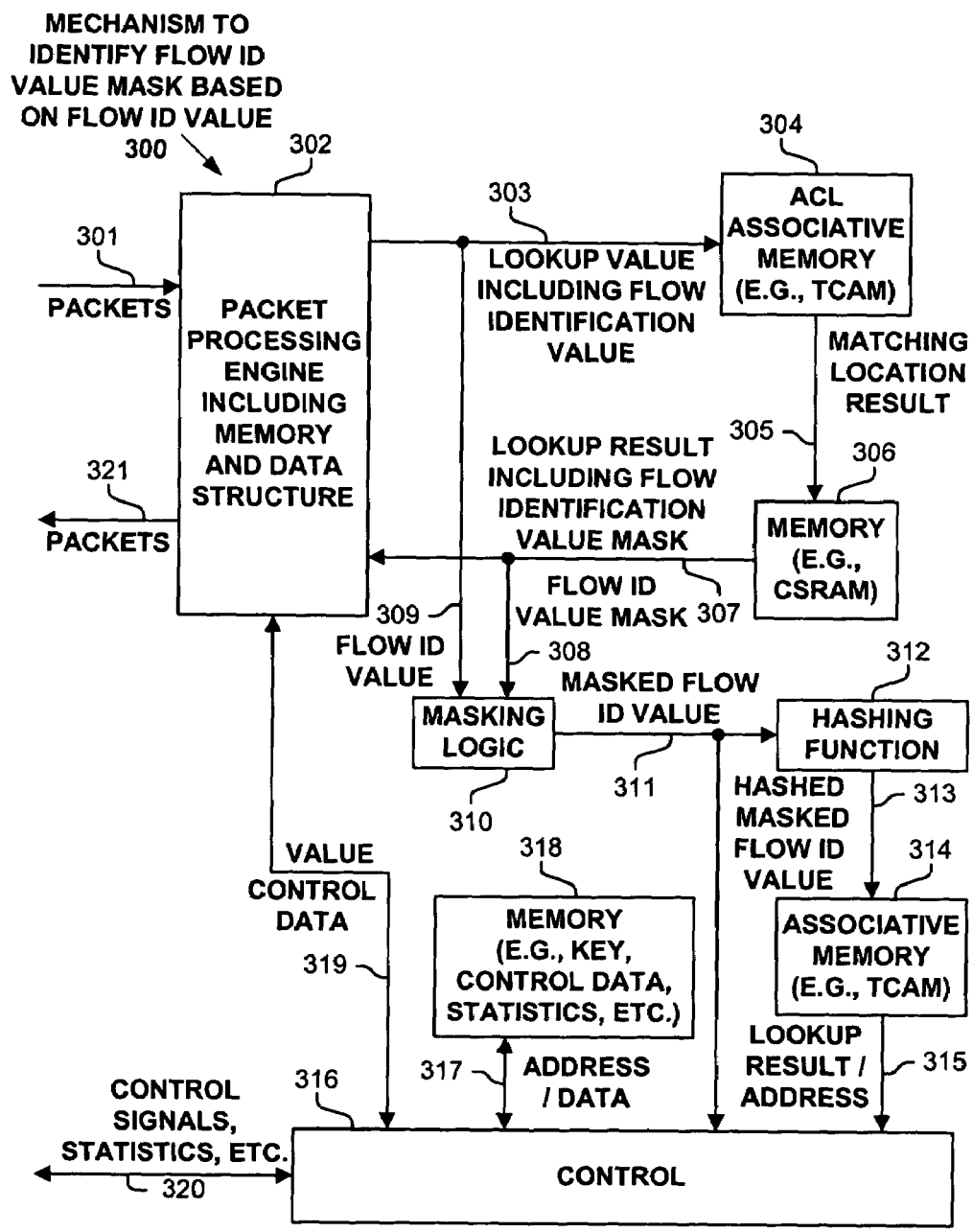
FIG. 3A is a block diagram of exemplary system used in one used in one embodiment for identifying a flow identification value mask based on a flow.

FIG. 3A is a block diagram of exemplary system used in one used in one embodiment for identifying a flow identification value mask based on a flow identification value. As shown, flow based flow identification value mask identification mechanism 300 receives packets 301 and sends packets 321. Packet processing engine 302, typically includes memory (including a data structure for storing values and packets). Packet processing engine 302 generates a lookup value 303, typically including or equal to the flow of a received packet. Associative memory 304, possibly including access control list entries, performs a lookup operation based on lookup value 303 to generate matching location result 305. Adjunct memory 306 performs a lookup operation based on matching location result 305 to generate lookup result 307, which includes the flow identification value mask and possibly other values. Lookup result 307 is typically provided to packet processing engine 302. In addition, masking logic 310 receives flow identification value 309 and flow identification value mask 308 and produces masked flow identification value 311, typically using logic gates to perform bit level "and" operations (or any other masking technique or mechanism). Masked flow identification value 311 is then hashed (using any technique) by hashing function 312 to generate hashed masked flow identification value 313, based on which associative memory 314 performs a lookup operation to generate lookup result (e.g., an address) 315. Control 316 then performs a lookup operation on memory 318 via address/data connections 317 based on lookup result 315.

Figure 3B:
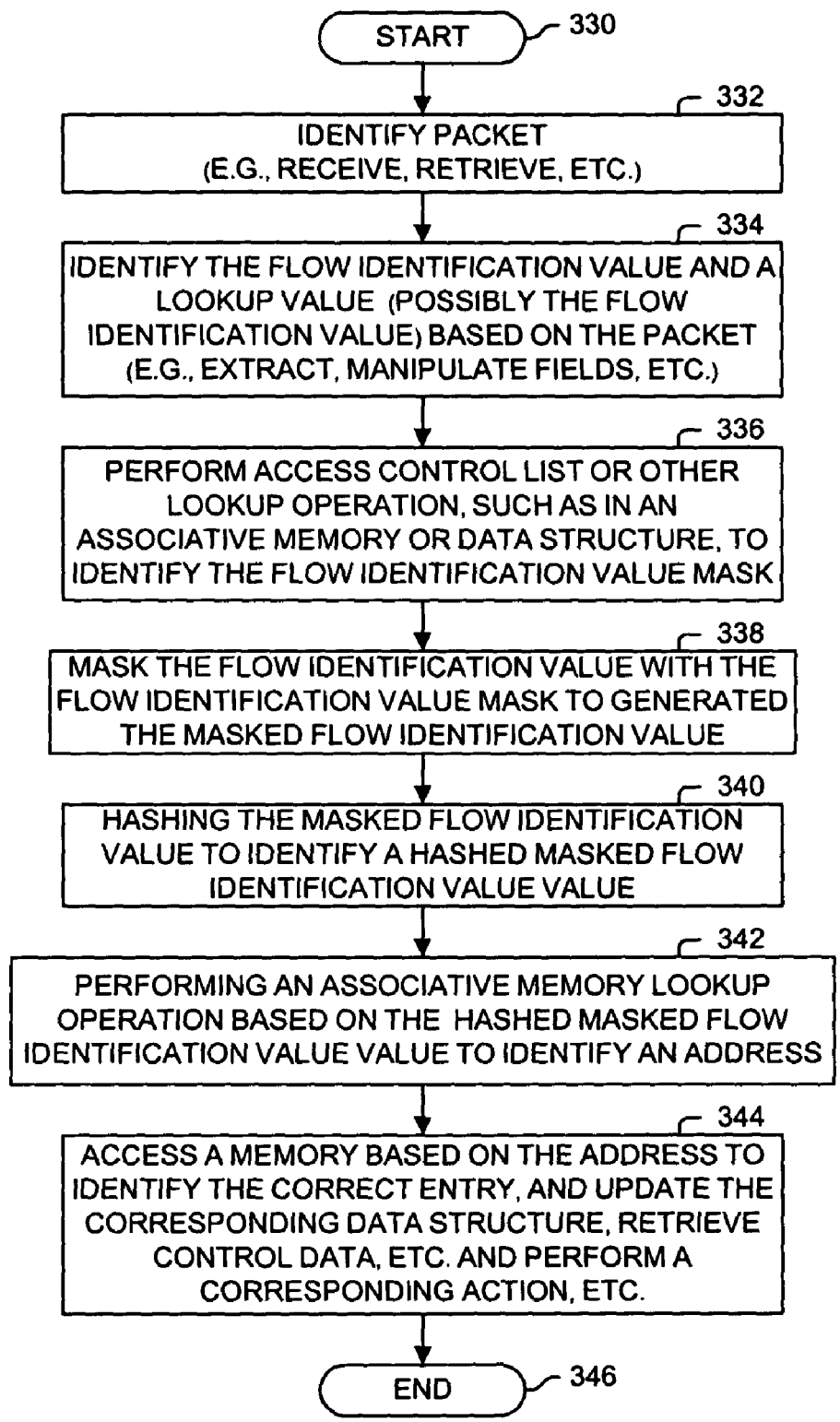
FIG. 3B is a flow diagram of a process used in one embodiment for identifying a flow identification value mask based on a flow.
Figure 3C:
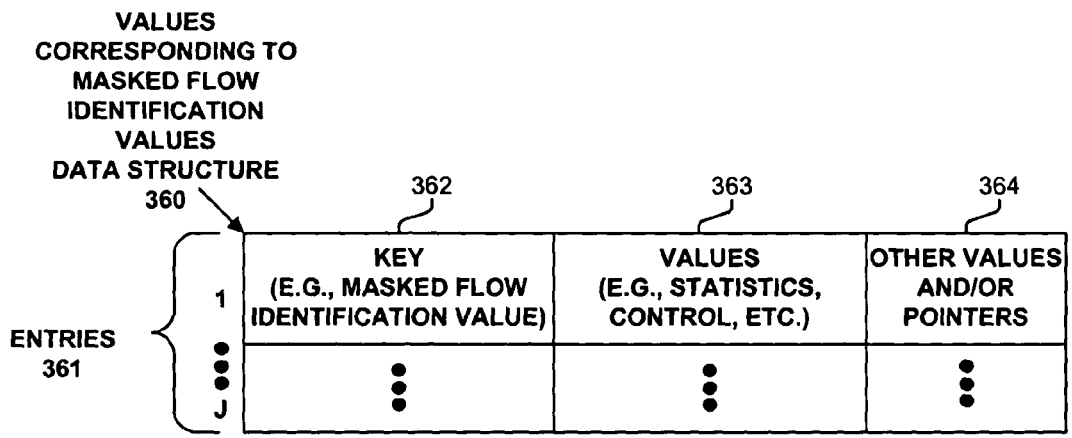
FIG. 3C is a diagram of an exemplary data structure used in one embodiment.

Turning to FIG. 3C, illustrate is a data structure stored in memory 318 in one embodiment. As shown, values corresponding to masked flow identification values data structure 360 includes J entries, each with a hash key 362, values 363 (e.g., one or more statistic or billing values, control parameters for indicating how to process a packet or perform some other manipulation, any other value, etc.) Additionally, in one embodiment, entries 361 include an optional field 364 for other values and/or pointers, such as for chaining colliding hashed values, etc.

Control 315 retrieves the corresponding entry 361 from memory 318, and compares the hash key 362 with masked flow identification value 311 to confirm that the appropriate location has been retrieved (and retrieves additional entries as needed to get the proper entry 361). In one embodiment, control 316 updates value 363 by a predetermined amount (e.g., one for one packet, etc.), or based on value 319 (e.g., a byte count, etc.) generated by packet processing engine 302. In one embodiment, control 316 sends control data from values 363 to packet processing engine 302, which typically performs some operation in response. Also shown in FIG. 3A is connection 320 for receiving and sending control and other signals and/or statistics or other values.

FIG. 3B is a flow diagram of a process used in one embodiment for identifying a flow identification value mask based on a flow identification or other value corresponding processing a packet (e.g., updating a data structure, routing or dropping a packet, etc.) Processing begins with process block 330, and proceeds to process block 332, wherein a packet is identified (e.g., received, retrieved from memory or a queue, or acquired via any other mechanism). Next, in process block 334, a flow identification value and a lookup value corresponding to the packet are identified based on the packet (e.g., extracted and/or manipulated values/fields). In one embodiment, the lookup value includes (and possibly is) the flow identification value itself. Next, in process block 336, a lookup operation is performed in a memory, associative memory, data structure, or other device based on the lookup value (e.g., flow or other value) to identify the corresponding flow identification value mask. In one embodiment, this lookup operation is performed on access control list entries stored in a memory, associative memory, data structure, or other device. Next, in process block 338, the flow identification value is masked with the flow identification value mask to generate a masked flow identification value. In process block 340, the masked flow identification value is hashed to generate the hashed masked flow identification value, based on which in process block 342, an associative memory lookup operation is performed to identify an address. Based on which in process block 344, the corresponding entry (e.g., the one with the matching hash key) is identified and a statistics value associated therewith is updated, some control data is retrieved, and/or some other operation is performed. Processing is then complete as indicated by process block 346.

Figure 4A:
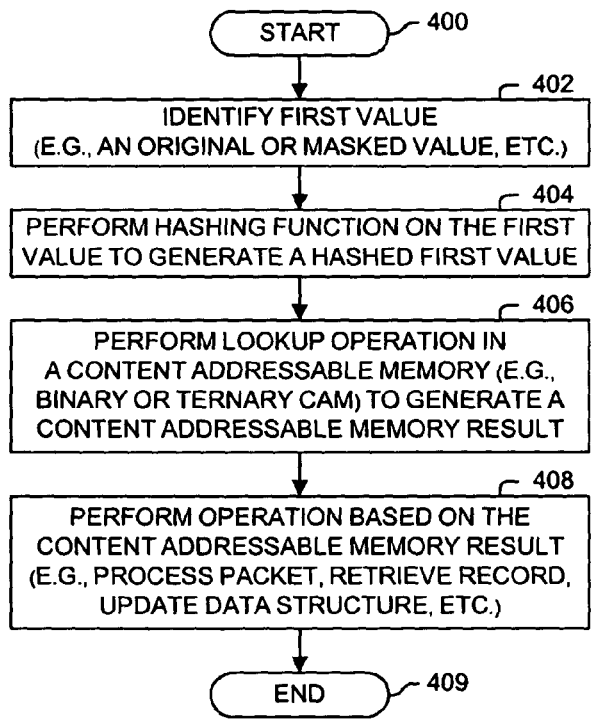
FIG. 4A is a flow diagram of a process used in one embodiment for hashing a value and then performing a lookup operation in a content addressable memory.

FIG. 4A is a flow diagram of a process used in one embodiment for hashing a value and then performing a lookup operation in a content addressable memory. Processing begins with process block 400, and proceeds to process block 402, wherein a first value (e.g., an original or masked value) is identified. Next, in process block 404, a hashing function is performed on the first value to generate a hashed first value. In process block 406, a lookup operation is performed in a content addressable memory (e.g., a binary or ternary content addressable memory) to generate a content addressable memory result. In process block 408, an operation is performed based on the content addressable memory result. This operation may include, but is not limited to processing a packet, retrieving a record, updating a data structure, etc.). Processing is complete as indicated by process block 409.

Figure 4B:
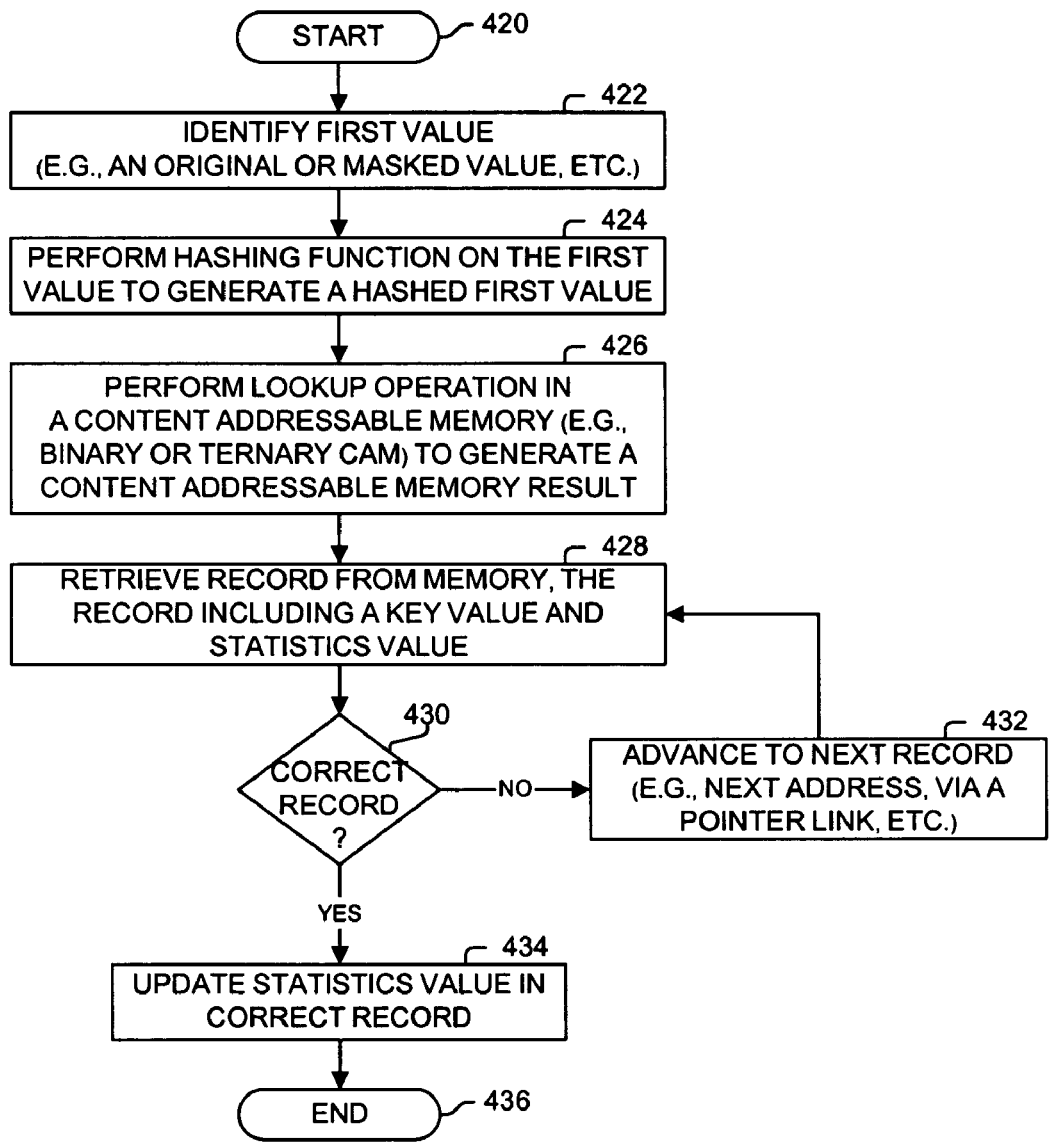
FIG. 4B is a flow diagram of a process used in one embodiment for hashing a value and then performing a lookup operation in a content addressable memory.

FIG. 4B is a flow diagram of a process used in one embodiment for hashing a value and then performing a lookup operation in a content addressable memory. Processing begins with process block 420, and proceeds to process block 422, wherein a first value (e.g., an original or masked value) is identified. Next, in process block 424, a hashing function is performed on the first value to generate a hashed first value. In process block 426, a lookup operation is performed in a content addressable memory (e.g., a binary or ternary content addressable memory) to generate a content addressable memory result. Next, in process block 428, a record is retrieved from memory, the record including a key value and a statistics value. As determined in process block 430, if the record is not the correct record (e.g., the key value matches the first value), then in process block 432, a next record to check is identified such as by advancing to the address of a next record in memory location or by following a pointer (e.g., one contained in the record), etc., and processing returns to process block 428. Otherwise, the correct record was retrieved, and in process block 434, a statistics value in the record (or other memory location) is updated. In one embodiment, an operation is performed in addition to, or instead of updating the statistics value. This operation may include, but is not limited to processing a packet, retrieving a record, updating a data structure, etc.). Processing is complete as indicated by process block 436.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method for use with a content addressable memory, the method comprising:
   identifying a first value;
   performing a hashing function on the first value to generate a hashed first value;
   performing a lookup operation in the content addressable memory based on a lookup value including the hashed first value to generate a first content addressable memory result, wherein the first content addressable memory result includes an address; and
   retrieving a record from an adjunct memory at a position corresponding to the address identified by said lookup operation, wherein the record includes a key value and a statistics value; comparing the key value to the first value; and in response to the key value matching the first value, updating the statistics value.

2. The method of claim 1, wherein said identifying the first value includes masking an original value with a mask value to generate the first value.

3. The method of claim 1, wherein the first value includes a masked value.

4. The method of claim 1, wherein the first value includes a masked flow identification value.

5. A apparatus for use with a content addressable memory, the apparatus comprising:
   means for identifying a first value;
   means for performing a hashing function on the first value to generate a hashed first value;
   means for performing a lookup operation in the content addressable memory based on a lookup value including the hashed first value to generate a first content addressable memory result, the first content addressable memory result including an address;
   means for retrieving a record from an adjunct memory at a position corresponding to the address, the record including a key value and a statistics value; and
   means for updating the statistics value in response to a comparison operation determining that the key value matches the first value.

6. The apparatus of claim 5, wherein said means for identifying the first value includes means for masking an original value with a mask value to generate the first value.

7. The apparatus of claim 5, wherein the first value includes a masked value.

8. The apparatus of claim 5, wherein the first value includes a masked flow identification value.

9. An apparatus comprising:
   a hashing function configured to hash a first value to generate a hashed first value;
   a content addressable memory configured to perform a lookup operation based on a lookup value including the hashed first value to generate a first content addressable memory result;
   an adjunct memory configured to perform a memory read operation at a location identified by the first content addressable memory result to generate a memory record, the memory record including a key value and a second value; and
   control logic configured to compare the key value to the first value with the key value and to perform an operation based on the second value in response to determining that the key value matches the first value.

10. The apparatus of claim 9, comprising masking logic configured to mask an original value to generate the first value.

11. The apparatus of claim 9, comprising masking logic configured to mask a flow identification value to generate the first value.

12. The apparatus of claim 9, wherein the second value corresponds to a statistics value; and said control logic is configured to update the second value.

13. A method for processing packets, the method comprising:
    identifying a packet;
    identifying a flow identification value based on the packet;
    performing a lookup based on a lookup value including the flow identification value to identify a flow identification value mask;
    masking the flow identification value with the flow identification value mask to generate a masked flow identification value;
    hashing the masked flow identification value identification value to generate a hashed masked flow identification value identification value;
    performing an content addressable memory lookup operation on a set of content addressable memory entries based on a lookup value including hashed masked flow identification value identification value to identify an address location; and
    performing an operation based on the address location.

14. The method of claim 13, wherein said performing the operation includes updating a value stored a location corresponding to the address location.

15. The method of claim 13, wherein said performing the operation includes retrieving a value stored a location corresponding to the address location.

16. The method of claim 13, wherein said performing a lookup based on the flow identification value to identify a flow identification value mask includes performing the lookup on a set of values corresponding to access control list entries.

17. An apparatus for processing packets, the apparatus comprising:
   a packet processing engine configured to identify a packet and a flow identification value based on the packet;
   an content addressable memory configured to perform a first lookup operation based on the flow identification value to identifying a matching location;
   an adjunct memory configured to perform a second lookup operation based on the matching location to identify a flow identification value mask;
   masking logic configured to mask the flow identification value with the flow identification value mask to generate a masked flow identification value;
   a hashing function configured to hash the masked flow identification value to generate a hashed masked flow identification value;
   a second content addressable memory configured to perform a third lookup operation based on the masked flow identification value to identify a third lookup result;
   a value memory for storing values; and
   a control configured to update a value at a position corresponding to the third lookup result in the value memory.

18. A computer-reable medium storing computer-executable instructions to perform steps for processing packets, said steps comprising:
   identifying a packet;
   identifying a flow identification value based on the packet;
   performing a lookup based on the flow identification value to identify a flow identification value mask;
   masking the flow identification value with the flow identification value mask to generate a masked flow identification value;
   hashing the masked flow identification value identification value to generate a hashed masked flow identification value identification value;
   performing an content addressable memory lookup operation on a set of content addressable memory entries to identify an address location; and
   performing an operation based on the address location.

19. The computer-readable medium of claim 18, wherein said performing the operation includes updating a value stored a location corresponding to the address location.

20. The computer-readable medium of claim 18, wherein said performing the operation includes retrieving a value stored a location corresponding to the address location.

21. The computer-readable medium of claim 18, wherein said performing a lookup based on the flow identification value to identify a flow identification value mask includes performing the lookup on a set of values correspond to access control list entries.

22. An apparatus for processing packets, the apparatus comprising:
   means for identifying a packet;
   means for identifying a flow identification value based on the packet;
   means for performing a lookup based on the flow identification value to identify a flow identification value mask;
   means for masking the flow identification value with the flow identification value mask to generate a masked flow identification value;
   means for hashing the masked flow identification value identification value to generate a hashed masked flow identification value identification value;
   means for performing an content addressable memory lookup operation on a set of content addressable memory entries to identify an address location; and
   performing an operation based on the address location.

23. The apparatus of claim 22, wherein said means for performing the operation includes means for updating a value stored a location corresponding to the address location.

24. The apparatus of claim 22, wherein said means for performing the operation includes means for retrieving a value stored a location corresponding to the address location.

25. The apparatus of claim 22, wherein said means for performing a lookup based on the flow identification value to identify a flow identification value mask includes means for performing the lookup on a set of values correspond to access control list entries.

* * * * *

UNITED STATES PATENT AND TRADEMARK OFFICE
CERTIFICATE OF CORRECTION

PATENT NO. : 7,197,597 B1 Page 1 of 1
APPLICATION NO. : 10/625012
DATED : March 27, 2007
INVENTOR(S) : Scheid et al.

It is certified that error appears in the above-identified patent and that said Letters Patent is hereby corrected as shown below:

Col. 13, line 29, replace "reable" with -- readable --

Signed and Sealed this

Thirtieth Day of October, 2007

JON W. DUDAS
*Director of the United States Patent and Trademark Office*